(12) United States Patent
Honda et al.

(10) Patent No.: US 9,420,725 B2
(45) Date of Patent: Aug. 16, 2016

(54) AIR CONDITIONING APPARATUS AND AIR CONDITIONING CONTROL METHOD

(71) Applicant: Kabushiki Kaisha Toshiba, Tokyo (JP)

(72) Inventors: Makoto Honda, Tokyo (JP); Hiroshi Morimoto, Tokyo (JP); Kazuhide Sato, Chiba (JP); Hideyoshi Ootani, Chiba (JP); Tomoyuki Kinoshita, Kanagawa (JP); Dai Murayama, Tokyo (JP); Yasuo Takagi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/821,777

(22) PCT Filed: Nov. 30, 2012

(86) PCT No.: PCT/JP2012/081190
§ 371 (c)(1),
(2) Date: Mar. 8, 2013

(87) PCT Pub. No.: WO2013/108495
PCT Pub. Date: Jul. 25, 2013

(65) Prior Publication Data
US 2014/0349563 A1 Nov. 27, 2014

(30) Foreign Application Priority Data
Jan. 18, 2012 (JP) .................................. 2012-008469

(51) Int. Cl.
*H05K 7/20* (2006.01)
*F24F 11/00* (2006.01)
(Continued)

(52) U.S. Cl.
CPC .......... *H05K 7/20709* (2013.01); *F24F 1/0007* (2013.01); *F24F 11/0001* (2013.01);
(Continued)

(58) Field of Classification Search
CPC . H05K 7/20709; F24F 1/0007; F24F 11/0001
See application file for complete search history.

(56) References Cited

U.S. PATENT DOCUMENTS 5,324,229 A * 6/1994 Weisbecker ............ F24F 13/04
454/233
5,346,127 A * 9/1994 Creighton ............ G05D 23/138
165/248

(Continued)

FOREIGN PATENT DOCUMENTS

JP       2005 172309       6/2005
JP       2007-64556 A      3/2007
(Continued)

OTHER PUBLICATIONS

Hara et al, JP 2010-261696 A English machine translation, Nov. 18, 2010.*
(Continued)

*Primary Examiner* — Alissa Tompkins
*Assistant Examiner* — Phillip E Decker
(74) *Attorney, Agent, or Firm* — Oblon, McClelland, Maier & Neustadt, L.L.P

(57) ABSTRACT

A controller and indoor unit introducing outdoor air and/or return air from an air conditioning control target, and discharging introduced air to the air conditioning control target as supply air. The indoor unit includes a first space including an outdoor air introducing unit introducing outdoor air, a cooler, and a second space including a return air introducing unit introducing return air from the air conditioning control target. The controller, after determining air conditioning control on the air conditioning control target is necessary, introduces the outdoor air to the first space through the outdoor air introducing unit, subjecting such to cooling by the cooler and/or dehumidification to result in processed outdoor air, and introduces the return air to the second space through the return air introducing unit, where the processed outdoor air is mixed with the return air and supplied to the air conditioning control target as the supply air.

8 Claims, 7 Drawing Sheets

(51) Int. Cl.
*F24F 1/00* (2011.01)
*F24F 3/14* (2006.01)

(52) U.S. Cl.
CPC ........ *H05K 7/20745* (2013.01); *H05K 7/20836* (2013.01); *F24F 3/14* (2013.01); *F24F 2001/0051* (2013.01); *F24F 2011/0002* (2013.01); *F24F 2011/0006* (2013.01)

(56) References Cited

U.S. PATENT DOCUMENTS

| | | | |
|---|---|---|---|
| 6,062,482 A * | 5/2000 | Gauthier et al. | 236/11 |
| 9,033,776 B2 * | 5/2015 | Kinoshita | F24F 11/0001 454/184 |
| 9,185,829 B2 * | 11/2015 | Murayama | H05K 7/20745 |
| 9,188,356 B2 * | 11/2015 | Murayama | F24F 11/0001 |
| 9,237,680 B2 * | 1/2016 | Murayama | H05K 7/20745 |
| 9,307,679 B2 * | 4/2016 | Murayama | H05K 7/20745 |
| 2006/0183419 A1 * | 8/2006 | Kettler | F24F 11/0009 454/256 |
| 2008/0185446 A1 * | 8/2008 | Tozer | H05K 7/20745 236/49.4 |
| 2010/0006662 A1 * | 1/2010 | Yonezawa et al. | 236/44 C |
| 2010/0130117 A1 * | 5/2010 | Larsen | F24F 11/0001 454/184 |
| 2011/0300789 A1 * | 12/2011 | Kinoshita et al. | 454/184 |
| 2011/0306287 A1 * | 12/2011 | Takagi et al. | 454/184 |
| 2011/0306288 A1 * | 12/2011 | Murayama et al. | 454/184 |
| 2012/0164930 A1 * | 6/2012 | Murayama et al. | 454/184 |
| 2012/0168119 A1 * | 7/2012 | Dunnavant | F24F 3/14 165/59 |
| 2012/0234527 A1 * | 9/2012 | Murayama et al. | 165/287 |
| 2013/0005235 A1 * | 1/2013 | Ootani et al. | 454/184 |
| 2013/0299157 A1 * | 11/2013 | Murayama et al. | 165/224 |

FOREIGN PATENT DOCUMENTS

| | | |
|---|---|---|
| JP | 2007-232331 A | 9/2007 |
| JP | 2009-162411 A | 7/2009 |
| JP | 2010 261696 | 11/2010 |
| JP | 2011 47581 | 3/2011 |
| JP | 2011 242008 | 12/2011 |
| JP | 2011 242009 | 12/2011 |
| JP | 2011 242010 | 12/2011 |
| JP | 2011 242077 | 12/2011 |
| JP | 2012 97961 | 5/2012 |
| JP | 2012 193876 | 10/2012 |
| JP | 2013 11427 | 1/2013 |
| JP | 2013 30027 | 2/2013 |
| JP | 2013-104639 A | 5/2013 |

OTHER PUBLICATIONS

Foreign Search Report Issued Jan. 29, 2013 in PCT/JP12/81190 Filed Nov. 30, 2012.
Extended European Search Report issued Oct. 12, 2015 in Patent Application No. 12856585.0.

* cited by examiner

SERVER TEMPERATURE/HUMIDITY CONDITION

| Class | Temperature | Humidity | Duw Point | Usage |
|---|---|---|---|---|
| A1 | 15 °C TO 32 °C | 20% TO 80% | 17 °C | Enterprise servers, storage products |
| A2 | 10 °C TO 35 °C | 20% TO 80% | 21 °C | Volume servers, storage products |
| A3 | 5 °C TO 40 °C | 8% TO 85% | 24 °C | Volume servers, storage products |
| A4 | 5 °C TO 45 °C | 8% TO 90% | 24 °C | Volume servers, storage products |

AIR CONDITIONING APPARATUS AND AIR CONDITIONING CONTROL METHOD

CROSS-REFERENCE TO RELATED APPLICATIONS

This application is national stage application of International Application No. PCT/JP2012/081190, filed Nov. 11, 2012, which designates the United States, incorporated herein by reference, and which claims the benefit of priority from Japanese Patent Application No. 2012-008469, filed on Jan. 18, 2012, the entire contents of which are incorporated herein by reference.

FIELD

Embodiments relate to an air conditioning apparatus and an air conditioning control method.

BACKGROUND

In recent years, as information technology (IT) has been introduced in various fields, the necessity of a data center that provides customers with a line connecting to a network, maintenance and operation service, and the like has increased.

Generally, many servers are installed in a server room of a data center and therefore the amount of heat generation is high. In this server room, in order to cause the servers to operate normally, it is necessary to appropriately perform air conditioning on the server room and maintain an environmental condition of a predetermined range.

As a technique of cooling the inside of a room in which many computers are installed such as the server room of the data center, there is an air conditioning apparatus configured to suck air from a lower space of the inside of the room and blow the air to an upper space so that the air is sucked into a space above a server rack.

Using this technique, a temperature gradient of the entire server room is reduced, and a variation in a supply air temperature is reduced, and thus air conditioning control can be efficiently performed.

However, when a load of an air conditioning target is an information device as in the server room of the data center, since most of loads are sensible heat loads, it is desirable that setting temperature and humidity are within a predetermined range, and since $CO_2$ is not generated from a load, air ventilation for preventing an increase in $CO_2$ density is unnecessary, that is, the server room has a feature different from a state inside a general building. However, in the past, air conditioning control corresponding to this feature is not performed, and thus there is a problem in that energy may be uselessly expended. For this reason, air conditioning apparatuses for server room management using outdoor air for implementing an air supply condition allowed in American society of heating, refrigerating and air-Conditioning engineers (ASHREA) 2008 have been already proposed. However, it is possible to further save energy using an air supply condition allowed in ASHREA 2011 in which the air supply condition on the server room is recently mitigated.

DESCRIPTION OF EMBODIMENTS

According to an embodiment, an air conditioning apparatus comprises: an indoor unit that introduces at least one of outdoor air and return air from an air conditioning control target, and discharges the introduced air to the air conditioning control target as supply air; and an air conditioning controller, wherein the indoor unit comprises a first space comprising an outdoor air introducing unit introducing the outdoor air and a cooler and a second space comprising a return air introducing unit introducing the return air from the air conditioning control target, when the air conditioning controller determines that air conditioning control on the air conditioning control target is necessary, the outdoor air is introduced to the first space through the outdoor air introducing unit, and is subjected to at least one of cooling by the cooler and dehumidification in the first space to be processed outdoor air, and the return air is introduced to the second space through the return air introducing unit, and in the second space, the processed outdoor air is mixed with the return air to be discharged to the air conditioning control target as the supply air.

Configuration of Server Room Management System

Figure 1:
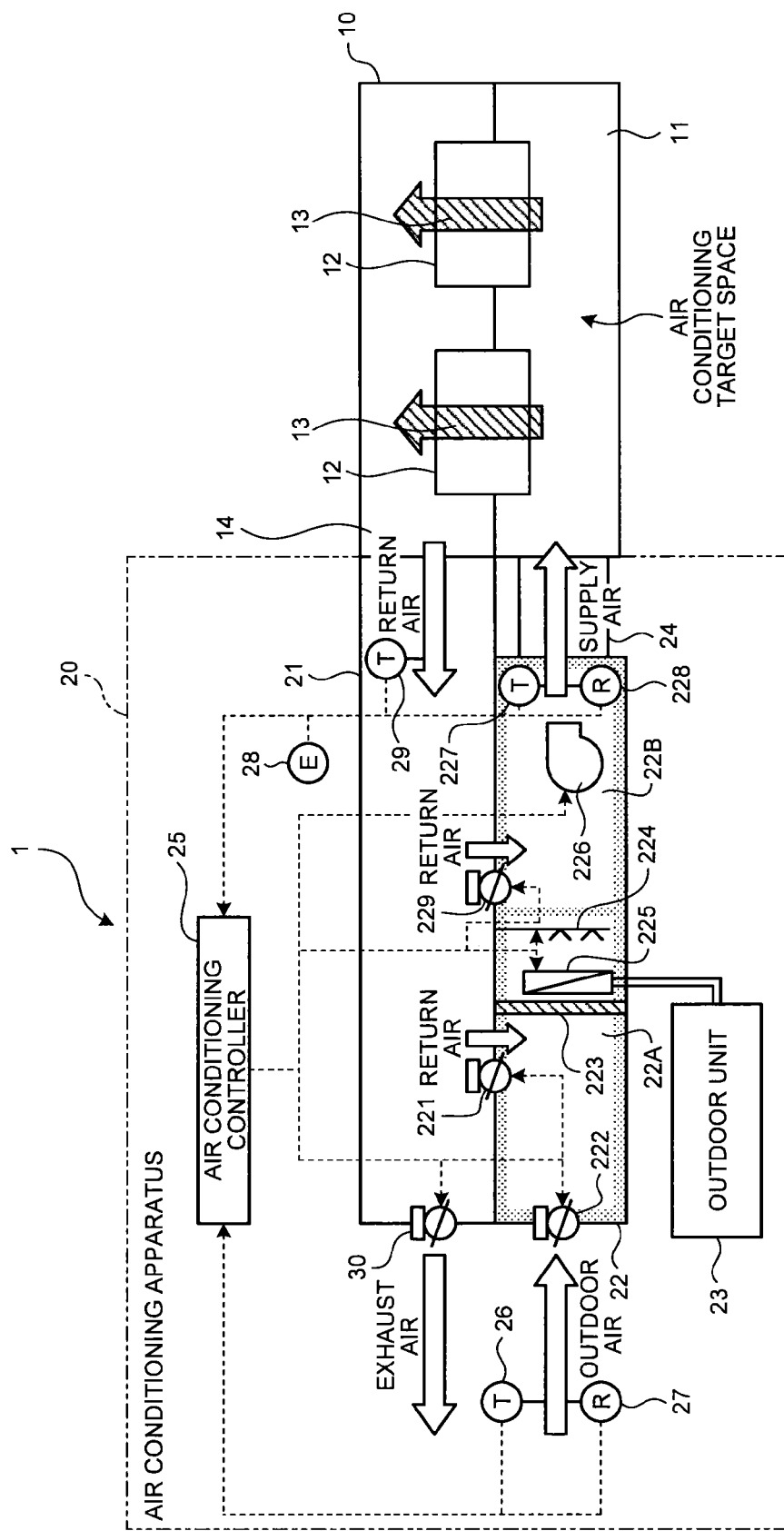
FIG. 1 is an overall diagram illustrating a configuration of an air conditioning apparatus according to an embodiment.

A configuration of a server room management system according to an embodiment will be described with reference to FIG. 1.

A server room management system 1 according to the present embodiment includes a server room 10 such as a data center and an air conditioning apparatus 20 that performs air conditioning of the server room 10. The server room 10 may be configured to be included in the air conditioning apparatus 20. In this case, the server room management system 1 of FIG. 1 corresponds to the air conditioning apparatus 20.

The server room 10 is, for example, an easily constructible container or a predetermined chamber in a building, and divided into two spaces, that is, a cold area 11 containing cold air as a third space and a hot area 14 containing warm air as a fourth space. One or more server racks 12 in which a plurality of servers (not illustrated) are stored are installed between the cold area 11 and the hot area 14.

In the server room 10 having the above configuration, a plurality of servers are stored in one or more server racks 12 such that an air current is generated in one direction by an operation of a built-in fan as an air blower (not illustrated), or a rack fan (not illustrated) is installed in the server rack 12 such that an air current is generated in one direction near a plurality of servers arranged in the server rack 12. Further, an air current denoted by a reference numeral 13 is generated such that cold air flowing into the cold area 11 enters the server rack 12 by fan operation in the server rack 12, and air warmed by heat generation of a plurality of servers in the server rack 12 flows out to the hot area 14.

Further, the server room 10 may be configured such that a double floor having a plurality of openings is installed, and one or more server racks in which a plurality of servers are stored is installed on the double floor. In this server room 10, due to an operation of a fan installed in the server or a fan installed in the server rack, cold air (supply air) flowing into a space below the double floor serving as the cold area 11 is sucked from the opening of the double floor into the server rack above the opening. Then, the air current 13 is generated such that the sucked cold air is heated by heat generation of a plurality of servers, and flows out to the hot area 14 above the double floor as return air.

As described above, heat generated from the server is cooled by the cold air, and thus the server can normally operate.

The air conditioning apparatus 20 includes a return air duct 21, an indoor unit 22, an outdoor unit 23, an air supply duct 24, an air conditioning controller 25, an outdoor air temperature sensor 26, an outdoor air humidity sensor 27, and an environmental sensor 28, and the return air duct 21 includes a return air temperature sensor 29 and an exhaust damper 30. In FIG. 1, a signal line to the air conditioning controller 25 and a signal line from the air conditioning controller 25 are indicated by dotted lines.

The return air duct 21 is a tube through which air (return air) passes, and connected with the hot area 14 of the server room 10 and the indoor unit 22 of the air conditioning apparatus 20.

The return air temperature sensor 29 measures the temperature of the return air flowing in from the hot area 14, and transmits the measurement value to the air conditioning controller 25.

The exhaust damper 30 adjusts the amount of return air by its opening degree when the return air is discharged from the return air duct 21 to the outside.

The indoor unit 22 includes a first return air introducing damper 221 serving as a return air introducing unit for introducing the return air into a space 22A (described below), an outdoor air introducing damper 222 serving as an outdoor air introducing unit, a filter 223, a humidifier 224 serving as a humidifying device, a cooling coil (a cooler) 225 serving as a cold air generating device, an air supply fan (an air blower) 226, a supply air temperature sensor 227 serving as a supply air temperature measuring device, a supply air humidity sensor 228 serving as a supply air humidity measuring device, and a second return air introducing damper 229 serving as a return air introducing unit for introducing the return air into a space 22B (described below). Here, for the sake of description, a space including the first return air introducing damper 221, the outdoor air introducing damper 222, the filter 223, the humidifier 224, and the cooling coil 225 is referred to as the space 22A as a first space in the indoor unit 22, and a space including the air blower 226, the supply air temperature sensor 227, the supply air humidity sensor 228, and the second return air introducing damper 229 is referred to as the space 22B as a second space in the indoor unit 22.

The first return air introducing damper 221 adjusts the amount of return air to be introduced from the return air duct 21 into the space 22A at a stage prior to the cooling coil 225 in the indoor unit 22 by its opening degree.

The outdoor air introducing damper 222 adjusts the amount of outdoor air to be introduced into the indoor unit 22 by its opening degree.

The filter 223 mainly removes dust from the outdoor air to be introduced when the outdoor air introducing damper 222 is an open state.

The humidifier 224 humidifies the outdoor air to be introduced when the outdoor air introducing damper 222 is in the open state and the return air to be introduced from the return air duct 21 when the first return air introducing damper 221 is in the open state as necessary, and generates cold air.

The cooling coil 225 cools the outdoor air to be introduced when the outdoor air introducing damper 222 is in the open state and the return air to be introduced from the return air duct 21 when the first return air introducing damper 221 is in the open state as necessary, and generates cold air.

When air is humidified by the humidifier 224 as necessary, the air supply fan 226 blasts supply air cooled and generated by the cooling coil 225 as necessary or supply air mixed with the return air flowing in from the second return air introducing damper 229, and sends the supply air to the cold area 11 of the server room 10 from the air supply duct 24. The blast volume is controlled by controlling the speed of revolution of the air supply fan 226. In the present embodiment, the air supply fan 226 causing the supply air to flow into the cold area 11 of the server room 10 is installed, but instead of the air supply fan 226, a return air fan that causes the return air to flow out of the hot area 14 of the server room 10 may be installed at the return air duct 21 side in the air conditioning apparatus 20 as an air blower that causes the supply air to flow into the cold area 11 of the server room 10 and causes the return air to flow out of the hot area 14 of the server room.

The supply air temperature sensor 227 measures the temperature of the supply air to flow into the cold area 11 of the server room 10, and transmits a measurement value to the air conditioning controller 25.

The supply air humidity sensor 228 measures humidity of the supply air to flow into the cold area 11 of the server room 10, and transmits a measurement value to the air conditioning controller 25.

The second return air introducing damper 229 adjusts the amount of return air to be introduced from the return air duct 21 into the space 22B at a stage subsequent to the cooling coil (the cooler) 225 in the indoor unit 22 by its opening degree.

The outdoor unit 23 is connected to the cooling coil 225, and supplies a coolant used to generate cold air in the cooling coil 225 to the cooling coil 225.

The air supply duct 24 is a tube through which air (here, supply air) passes, and connects the indoor unit 22 with the cold area 11 of the server room 10.

The outdoor air temperature sensor 26 measures the outdoor air temperature, and transmits a measurement value to the air conditioning controller 25. The outdoor air humidity sensor 27 measures outdoor air humidity, and transmits a measurement value to the air conditioning controller 25. The environmental sensor 28 measures, for example, smoke or dust of air (outdoor air) outside the indoor unit 22, and transmits a measurement result to the air conditioning controller 25.

Figure 2:
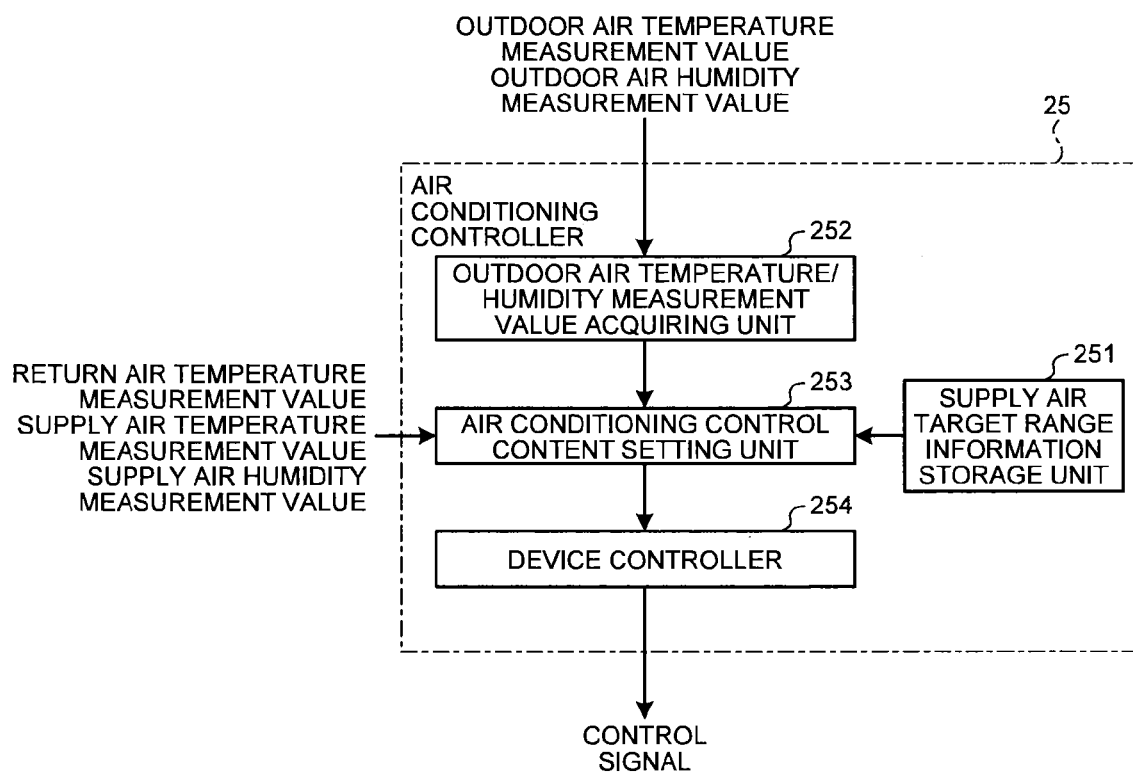
FIG. 2 is a block diagram illustrating a configuration of an air conditioning controller of the air conditioning apparatus according to the same embodiment.

The air conditioning controller 25 includes a supply air target range information storage unit 251, an outdoor air temperature/humidity measurement value acquiring unit 252, an air conditioning control content setting unit 253, and a device controller 254 as illustrated in FIG. 2.

The supply air target range information storage unit 251 stores a supply air temperature target range and a supply air humidity target range on the cold area 11 of the server room 10.

The outdoor air temperature/humidity measurement value acquiring unit 252 acquires the outdoor air temperature measurement value measured by the outdoor air temperature sensor 26 and the outdoor air humidity measurement value measured by the outdoor air humidity sensor 27.

The air conditioning control content setting unit 253 acquires the outdoor air temperature measurement value and the outdoor air humidity measurement value acquired from the outdoor air temperature/humidity measurement value acquiring unit 252, the return air temperature measurement value measured by the return air temperature sensor 29, the supply air temperature measurement value measured by the supply air temperature sensor 227, and the supply air humidity measurement value measured by the supply air humidity sensor 228, and sets air conditioning control content for generating the supply air within the temperature range and the humidity range which are set in advance based on the above measurement values and the supply air temperature target range and the supply air humidity target range stored in the supply air target range information storage unit 251 (the details will be described later). Further, the air conditioning control content setting unit 253 sets exceptional air conditioning control content (which will be described later) as necessary based on the measurement value of the smoke, the dust, or the like measured by the environmental sensor 28.

The device controller 254 controls an operation of each device in the air conditioning apparatus 20 based on the air conditioning control content set by the air conditioning control content setting unit 253.

The air conditioning controller 25 may be configured with a general computer device or the like, and the supply air target range information storage unit 251 may be implemented as a storage device such as a memory provided in the computer device. Further, the outdoor air temperature/humidity measurement value acquiring unit 252, the air conditioning control content setting unit 253, and the device controller 254 may be implemented as a function by a central processing unit (CPU) and a storage device provided in the computer device, a control program which is stored in the storage device and executed by the CPU, and an input/output interface.

Operation of Server Room Management System

Next, an operation of the server room management system 1 according to the present embodiment will be described.

In the present embodiment, the supply air temperature target range and the supply air humidity target range on the cold area 11 of the server room 10 are stored in the supply air target range information storage unit 251 of the air conditioning controller 25 of the server room management system 1 in advance.

In the present embodiment, as the supply air temperature target range and the supply air humidity target range on the cold area 11 of the server room 10, according to the standard (see FIG. 8) of American society of heating, refrigerating and air-Conditioning engineers (ASHRAE) 2011 release, a range corresponding to an A1 class is employed for the temperature and the humidity, a range corresponding to an A3 class is employed for the absolute humidity (corresponding to the dew-point temperature). Specifically, a range of the absolute humidity of 0.019 kg/kg (DA) or less corresponding to the temperature of 15 to 32° C., the relative humidity of 20% to 80%, and the dew-point temperature of 24° C. is employed. This information is stored in the supply air target range information storage unit 251. Further, any one of A1 to A4 may be set to the supply air target range information storage unit 251.

An operation of the air conditioning controller 25 for controlling each device in the state in which the supply air temperature target range and the supply air humidity target range are stored in the supply air target range information storage unit 251 as described above will be described.

First, the air conditioning control content setting unit 253 acquires the outdoor air temperature measurement value and the outdoor air humidity measurement value acquired by the outdoor air temperature/humidity measurement value acquiring unit 252.

Next, the air conditioning control content setting unit 253 sets the air conditioning control content for generating the supply air within the supply air temperature target range and the supply air humidity target range which are set in advance, based on the supply air temperature target range and the supply air humidity target range stored in the supply air target range information storage unit 251. A process of setting the air conditioning control content which is executed by the air conditioning control content setting unit 253 will be described below in detail.

Figure 3:
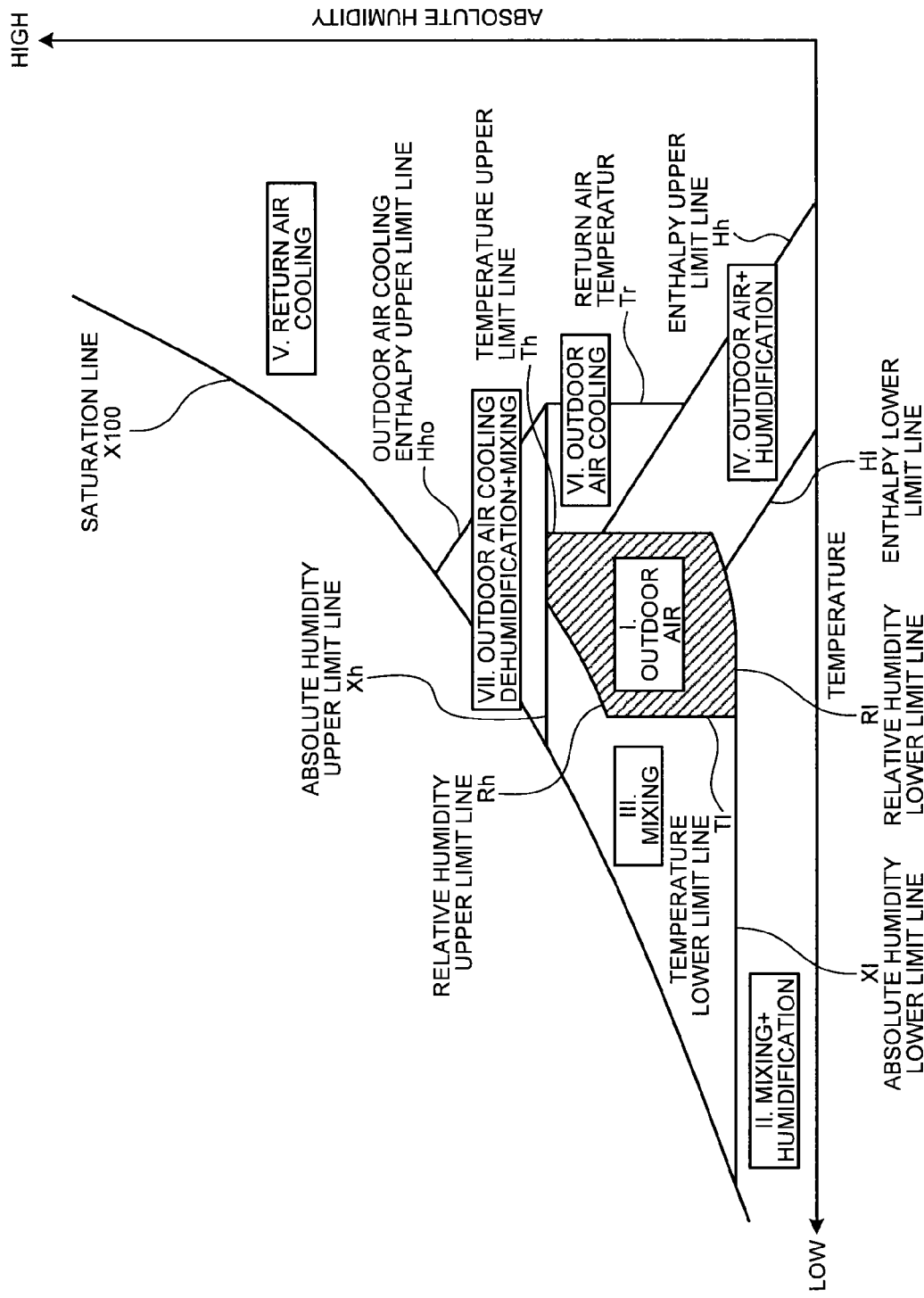
FIG. 3 is a graph illustrating an air condition range of outdoor air classified by the air conditioning controller of the air conditioning apparatus according to the same embodiment on a psychrometric diagram.

First, a region on a psychrometric diagram divided as illustrated in FIG. 3 to which a current outdoor air condition corresponds is determined based on the acquired outdoor air temperature measurement value and the outdoor air humidity measurement value. The psychrometric diagram refers to a diagram in which a status of moist air may be seen from a temperature, absolute/relative humidity, enthalpy (here, specific enthalpy), and the like on a diagram.

In the psychrometric diagram of FIG. 3, an air condition of relative humidity 100% (a saturated state) or less represented by an saturation line X100 is divided into regions I to VII representing seven air condition ranges which will be described below based on a value represented by the supply air temperature target range (a range represented by a temperature lower limit line Tl and a temperature upper limit line Th of FIG. 3) and the supply air humidity target range (a range represented by a relative humidity lower limit line Rl and a relative humidity upper limit line Rh of FIG. 3), an upper limit value of enthalpy represented by an enthalpy upper limit line Hh and a lower limit value of enthalpy represented by an enthalpy lower limit line Hl which correspond to an air condition of a range corresponding to the supply air temperature target range and the supply air humidity target range, an upper limit value of absolute humidity represented by an absolute humidity upper limit line Xh, a value of absolute humidity represented by an absolute humidity lower limit line Xl, a return air temperature (Tr), and an upper limit value of outdoor air cooling enthalpy represented by an outdoor air cooling enthalpy upper limit line Hho (which will be described later). In the present embodiment, an enthalpy upper limit value corresponding to the supply air temperature target range and the supply air humidity target range is assumed to be 50 kJ/kg(DA), and an enthalpy lower limit value is assumed to be 35 kJ/kg(DA).

Region I

First Air Condition Range

The region I refers to a range which is the same as the supply air temperature target range, the supply air relative humidity range, and the supply air absolute humidity range which serve as a target, that is, a range satisfying the following Formula (1) on the psychrometric diagram.

(temperature of 15 degree or more and 32 degree or less)

∩(relative humidity of 20% or more and 80% or less)

∩(absolute humidity of 0.019 kg/kg(DA) or less)    (1)

Region II

Second Air Condition Range

The region II refers to a range which is less than the lower limit value of the supply air relative humidity range serving as a target in a range of the lower limit value of the supply air temperature range or more, is less than the absolute humidity corresponding to the lower limit value of the supply air relative humidity range in a range of less than the lower limit value of the supply air temperature range, and is less than the enthalpy lower limit value in the range (that is, the region I) serving as a target, that is, a range satisfying the following Formula (2) on the psychrometric diagram.

{(temperature of 15 degree or more)∩(relative humidity of less than 20%)∩(specific enthalpy of less than 35 kJ/kg(DA))}

∪{(temperature of less than 15 degree)∩(absolute humidity of less than 0.002)}    (2)

Region III

Third Air Condition Range

The region III refers to a range which is the upper limit value of the supply air absolute humidity serving as a target or less, is a value of absolute humidity represented by the absolute humidity lower limit line Xl or more, and is less than the lower limit value of the supply air temperature range serving as a target or the upper limit value of the supply air relative humidity serving as a target or more, that is, a range satisfying the following Formula (3) on an air line.

(absolute humidity of 0.002 kg/kg(DA) or more and 0.019 kg/kg(DA) or less)

∩{(temperature less than 15 degree)∪(relative humidity of 80% or more)}    (3)

Region IV

Fourth Air Condition Range

The region IV refers to a range which is within an enthalpy range corresponding to the range of the supply air temperature and the supply air humidity serving as a target, and is less than the lower limit value of the supply air relative humidity range serving as a target or larger than the upper limit value of the supply air temperature range serving as a target, that is, a range satisfying the following Formula (4) on an air line.

(specific enthalpy of 35 kJ/kg(DA) or more and specific enthalpy of 50 kJ/kg(DA) or less)

∩{(relative humidity of less than 20%)∪(temperature of larger than 32° C.)}    (4)

Region VI

Sixth Air Condition Range

The region VI refers to a range which is less than the upper limit value of the supply air absolute humidity range serving as a target, is larger than the upper limit value of the enthalpy range corresponding to the range of the supply air temperature and the supply air humidity serving as a target, is the return air temperature or less, and is larger than the upper limit value of the supply air temperature range serving as a target, that is, a range satisfying the following Formula (5) on air line.

(absolute humidity of 0.019 kg/kg(DA) or less)

∩(specific enthalpy of larger than 50 kJ/kg(DA))

∩(return air temperature or less)

∩(temperature larger than 32° C.)    (5)

Region VII

Seventh Air Condition Range

The region VII refers to a range which is larger than the upper limit value of the supply air absolute humidity serving as a target, and is the upper limit value of outdoor air cooling enthalpy or less, that is, a range satisfying the following Formula (6) on an air line. The outdoor air cooling enthalpy upper limit line Hho is an enthalpy line corresponding to the return air temperature and the upper limit value of the supply air absolute humidity serving as a target, and is specified as an enthalpy line intersecting with a crossing point of the return air temperature Tr and the absolute humidity upper limit line Xh on the psychrometric diagram of FIG. 3.

(absolute humidity of larger than 0.019 kg/kg(DA))

∩(upper limit value of outdoor air cooling enthalpy or less)    (6)

Region V

Fifth Air Condition Range

The region V refers to a range other than the regions I to VII, but specifically, is a air condition range which is larger than the upper limit value of the enthalpy range corresponding to the air condition of the range corresponding to the supply air temperature target range and the supply air humidity target range, and is larger than the return air temperature or the upper limit value of the outdoor air cooling enthalpy as illustrated in FIG. 3.

Further, a condition corresponding to the region VI, the region VII, and a portion above the region I and a portion above the region III corresponds to an outdoor air condition frequently observed in a region of high-temperature and humidity such as a tropical rain forest climate province.

When a region to which the current outdoor air condition corresponds is decided from among the regions I to VII, the air conditioning control content setting unit 253 sets the air conditioning control content to each region as follows using the outdoor air temperature measurement value and the outdoor air humidity measurement value acquired by the outdoor air temperature/humidity measurement value acquiring unit 252, the return air temperature measurement value measured by the return air temperature sensor 29, the supply air temperature measurement value measured by the supply air temperature sensor 227, and the supply air humidity measurement value measured by the supply air humidity sensor 228. Here, a sensible heat load by heat generated from the servers in the server room 10 is assumed as a target of air conditioning control, a latent heat load by human breath or the like is assumed not to be generated, and the return air humidity value is the same as the supply air humidity measurement value measured by the supply air humidity sensor 228.

Air Conditioning Control Content when Air Condition Corresponds to Region I

When the current outdoor air condition is within the range of the region I, the outdoor air may be used as the supply air as is. Thus, the air conditioning control content setting unit 253 decides control content such that an outdoor air introduction rate becomes 100% by fully opening the exhaust damper 30, closing the first return air introducing damper 221 and the second return air introducing damper 229, and fully opening the outdoor air introducing damper 222. Further, at this time, the humidifying process by the humidifier 224 and the cooling process of mixed air by the cooling coil 225 are not performed.

Air Conditioning Control Content when Air Condition Corresponds to Region II

When the current outdoor air condition is within the range of the region II, the control content is decided such that the outdoor air temperature is increased by mixing the outdoor air with the return air, and humidifying is performed. Specifically, the air conditioning control content setting unit 253 decides the control content such that the second return air introducing damper 229 is closed, then the opening degrees of the exhaust damper 30, the first return air introducing damper 221, and the outdoor air introducing damper 222 are adjusted between 0 to 100% according to the outdoor air introduction rate, and the humidifier 224 performs humidifying of a necessary amount.

At this time, a target value α of the outdoor air introduction rate is adjusted according to the outdoor air temperature measurement value and the return air temperature measurement value so that the mixed air has a supply air temperature target value which is set in advance within the supply air temperature target range and the supply air humidity target range stored in the supply air target range information storage unit 251.

An absolute humidity value X of the air in which the outdoor air is mixed with the return air by adjusting the outdoor air introduction rate as described above is represented by the following Formula (7) using an outdoor air absolute humidity measurement value Xo, a return air absolute humidity measurement value Xr, and an outdoor air introduction rate target value α.

$$X = Xo \times \alpha + Xr \times (1-\alpha) \tag{7}$$

Thus, in order to cause the mixed air to reach the supply air of a temperature and humidity state serving as a target, humidifying of "Xs0−X" which is the difference between the absolute humidity value X and the supply air absolute humidity target value Xs0 of the mixed air is necessary. A necessary humidifying amount for increasing the humidity value of the difference is "Fs×(Xs0−X)" using a supply air current amount Fs, and control content of a valve (not illustrated) for controlling a water quantity of the humidifier 224 so that the necessary humidifying amount is supplied is decided. At this time, the cooling process of the mixed air by the cooling coil 225 is not performed.

The necessary humidifying amount used to perform humidifying after the outdoor air is mixed with the return air is decided as described above, but when humidifying is performed in advance so that the return air has an absolute humidity target value {Xr+(X−Xs0)/(1−α)}, humidifying after mixing is unnecessary.

In this case, the outdoor air introduction rate target value α is represented by the following Formula (8) using an outdoor air temperature measurement value To, a return air temperature value Tr2 after humidifying, and a supply air temperature target value Ts0.

$$\alpha = (Tr2-Ts0)/(Tr2-To) \times 100(\%) \tag{8}$$

Air Conditioning Control Content when Air Condition Corresponds to Region III

When the current outdoor air condition is within the range of the region III, the control content is decided such that the outdoor air temperature is increased by mixing the outdoor air with the return air. Specifically, the air conditioning control content setting unit 253 decides the control content such that the opening degrees of the exhaust damper 30, one of the first return air introducing damper 221 and the second return air introducing damper 229 (the other is closed at this time), and the outdoor air introducing damper 222 are adjusted between 0 to 100% according to the outdoor air introduction rate.

In this case, the outdoor air introduction rate target value α is represented by the following Formula (9) using the outdoor air temperature measurement value To, the return air temperature measurement value Tr, and the supply air temperature target value Ts0.

$$\alpha = (Tr-Ts0)/(Tr-To) \times 100(\%) \tag{9}$$

At this time, the humidifying process by the humidifier 224 and the cooling process by the cooling coil 225 are not performed.

Air Conditioning Control Content when Air Condition Corresponds to Region IV

When the current outdoor air condition is within the range of the region IV, the control content is decided such that the outdoor air is humidified. Specifically, the air conditioning control content setting unit 253 decides the control content such that the outdoor air introduction rate becomes 100% by fully opening the exhaust damper 30, closing the first return air introducing damper 221 and the second return air introducing damper 229, and fully opening the outdoor air introducing damper 222, and the humidifier 224 performs humidifying of a necessary amount.

In this case, when an outdoor air relative humidity measurement value is Ro and a supply air humidity target value is Rs0, the necessary humidifying amount is "Rs0−Ro." At this time, the outdoor air temperature lowers from To to T as the humidifying proceeds.

Air Conditioning Control Content when Air Condition Corresponds to Region V

When the current outdoor air condition is within the range of the region V, the control content is decided such that the return air is cooled. Specifically, the air conditioning control content setting unit 253 decides the control content such that the outdoor air introduction rate becomes 0% by closing the exhaust damper 30 and the second return air introducing damper 229, fully opening the first return air introducing damper 221 and closing the outdoor air introducing damper 222, and the cooling coil 225 performs the cooling process. At this time, the humidifying process by the humidifier 224 is not performed.

In addition, even when the current outdoor air condition is within the range of the region V, if an operator is in the server room 10 and air ventilation is necessary, the outdoor air introduction rate may be set to the lower limit value in advance, and control may be performed such that a predetermined amount of outdoor air is sucked.

Air Conditioning Control Content when Air Condition Corresponds to Region VI

Figure 4:
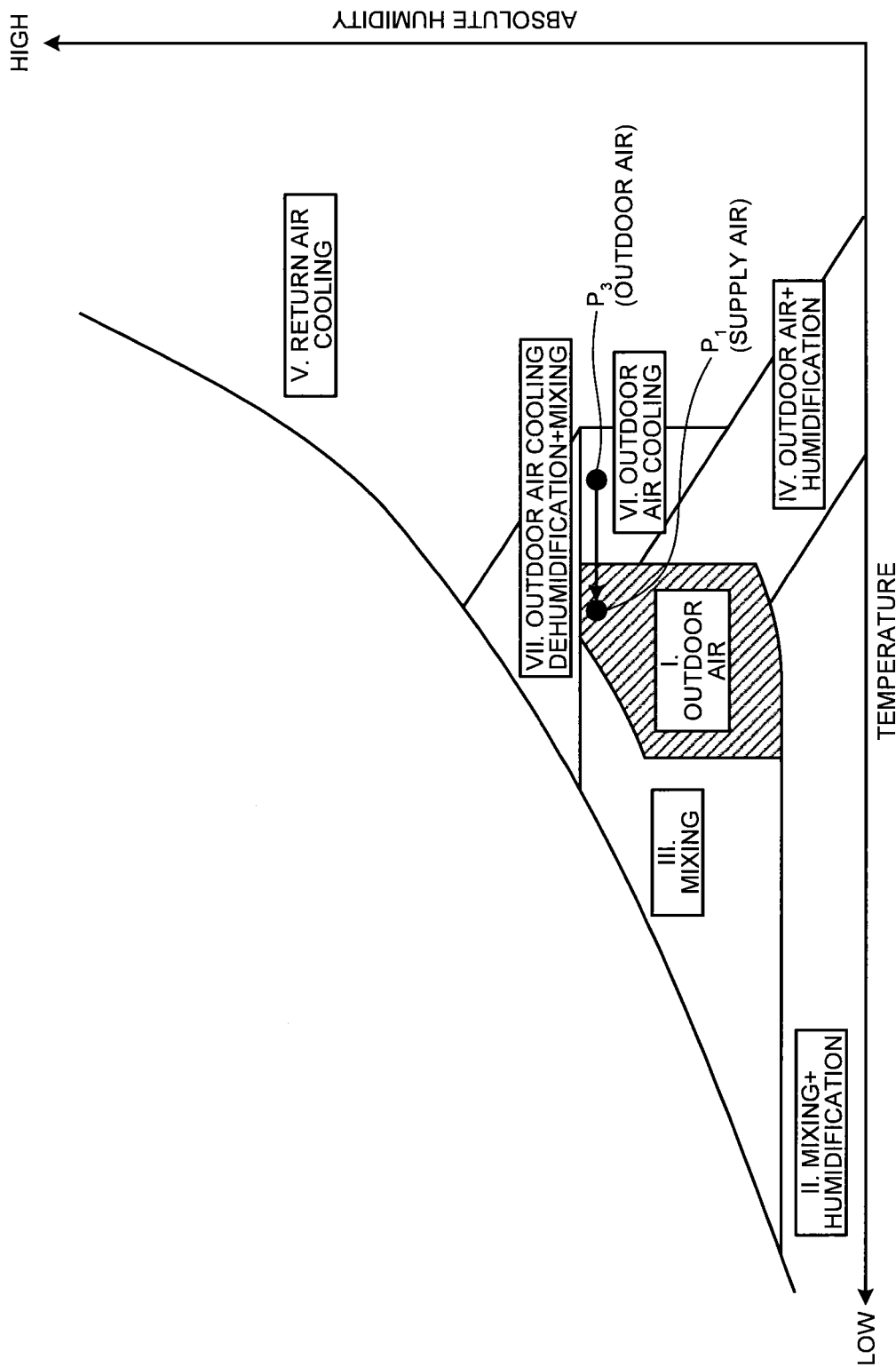
FIG. 4 is a graph illustrating an aspect of air conditioning control when an air condition corresponds to a region VI in the air conditioning controller according to the same embodiment on a psychrometric diagram.
Figure 5:
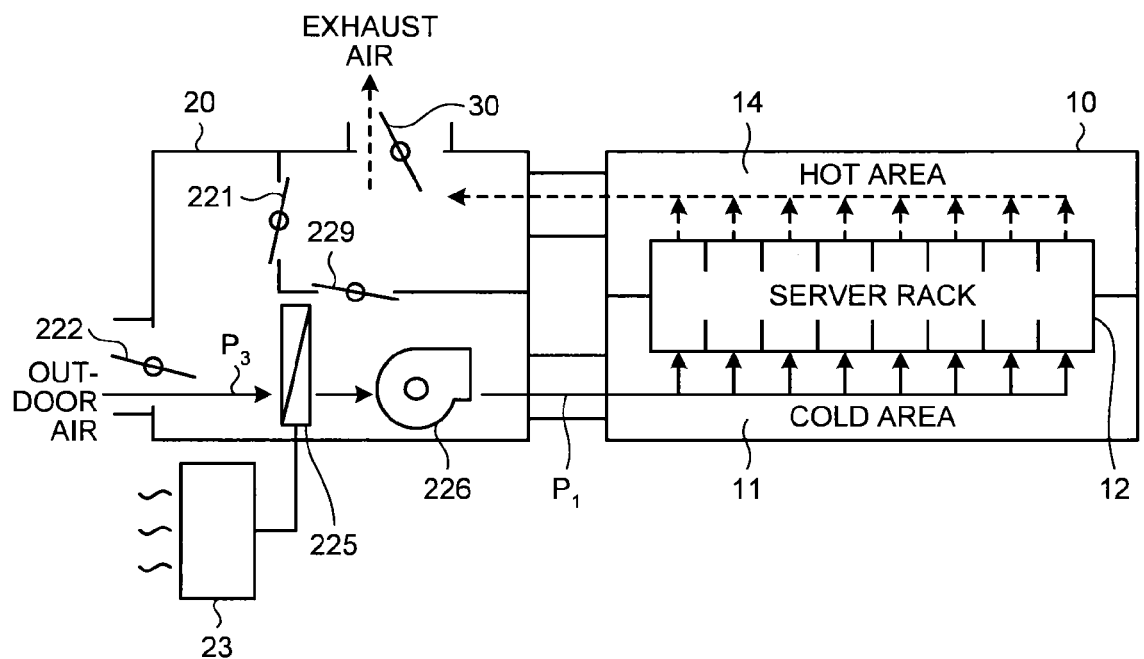
FIG. 5 is a diagram for explaining air conditioning control when an air condition corresponds to the region VI in the air conditioning controller according to the same embodiment.

When the current outdoor air condition is within the range of the region VI, the control content is decided such that the outdoor air is cooled. In other words, the control content is decided to be $P_3 \rightarrow P_1$ as illustrated in FIG. 4. Specifically, the air conditioning control content setting unit 253 decides the control content such that the outdoor air introduction rate becomes 100% by closing the first return air introducing damper 221 and the second return air introducing damper 229 and fully opening the exhaust damper 30 and the outdoor air introducing damper 222, and the cooling coil 225 performs the cooling process on the outdoor air ($P_3$) as illustrated in FIG. 5. At this time, the humidifying process by the humidifier 224 is not performed.

Air Conditioning Control Content when Air Condition Corresponds to Region VII

Figure 6:
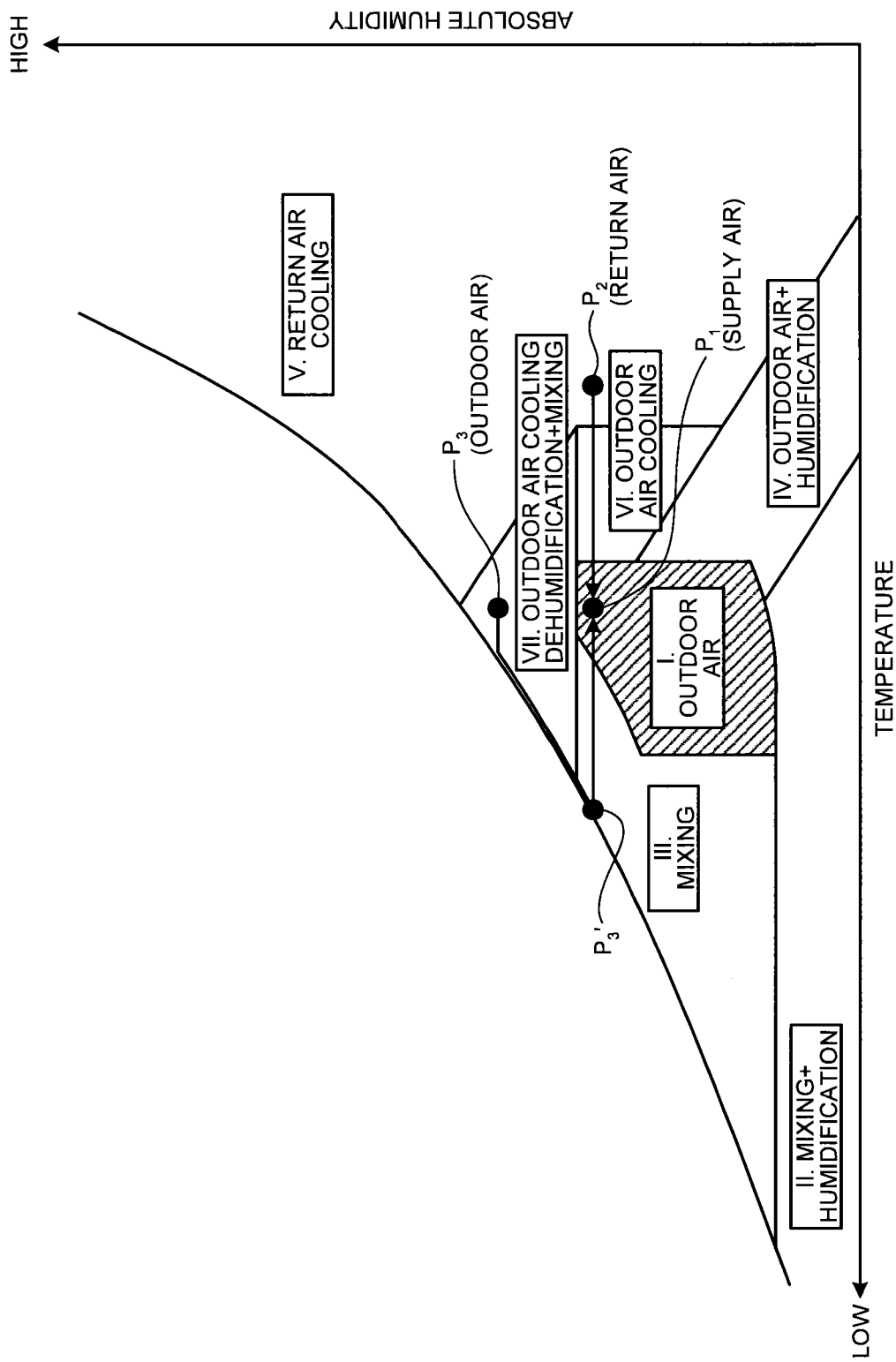
FIG. 6 is a graph for explaining an aspect of air conditioning control when an air condition corresponds to a region VII in the air conditioning controller according to the same embodiment on a psychrometric diagram.
Figures 7, 8:
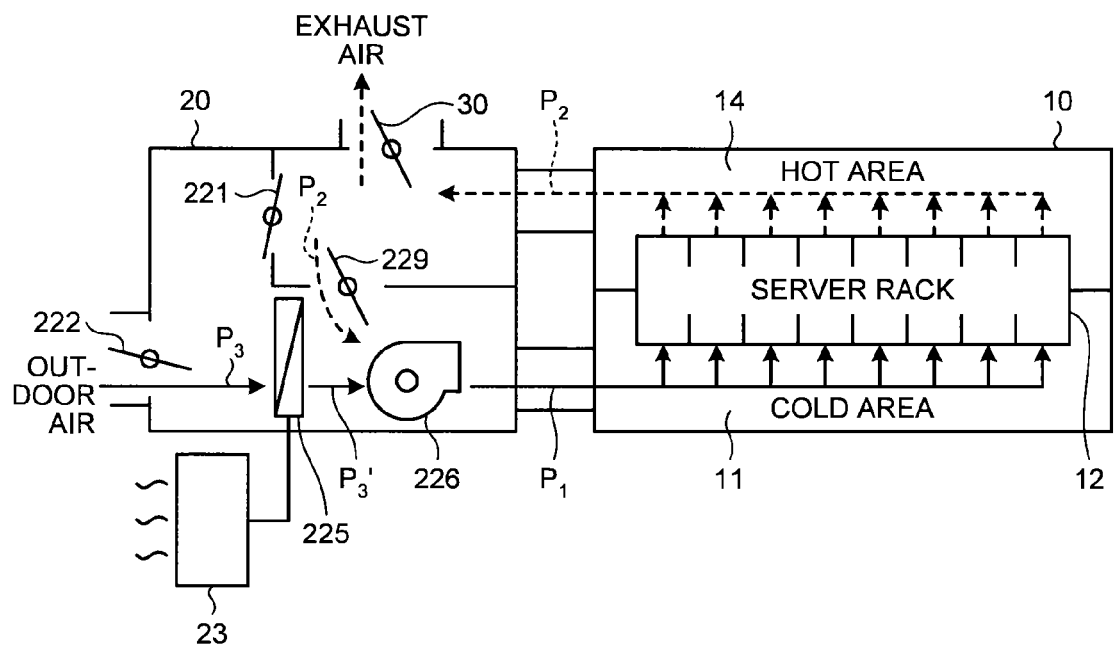
FIG. 7 is a diagram for explaining air conditioning control when an air condition corresponds to the region VII in the air conditioning controller according to the same embodiment.
FIG. 8 is a diagram illustrating a server temperature/humidity condition of ASHRAE 2011.

When the current outdoor air condition is within the range of the region VII, the control content is decided such that the outdoor air is cooled and dehumidified, and the cooled and dehumidified outdoor air is mixed with the return air. In other words, the control content is decided such that the introduced outdoor air ($P_3$) is cooled and dehumidified, cooled outdoor air ($P_3'$) is mixed with the return air ($P_2$), and so the supply air ($P_1$) has the air condition within the target region I as illustrated in FIG. 6. Specifically, the air conditioning control content setting unit 253 decides the control content such that the first return air introducing damper 221 is closed, and the exhaust damper 30, the second return air introducing damper 229, and the outdoor air introducing damper 222 are opened, but the opening degrees of the exhaust damper 30, the second return air introducing damper 229, and the outdoor air introducing damper 222 are adjusted between 0 to 100% according to the outdoor air introduction rate as illustrated in FIG. 7.

In this case, the outdoor air introduction rate target value α may be obtained by Formula (9) using the cooled outdoor air temperature measurement value as the outdoor air temperature measurement value To. At this time, the humidifying process by the humidifier 224 is not performed. The cooled outdoor air temperature may be estimated from the outdoor air temperature and the cooling performance of the cooling coil 225 or may be measured by a temperature sensor at an outdoor air sending side of the cooling coil 225.

Exceptional Air Conditioning Control Content

When the environmental sensor 28 detects that the outdoor air contains a lot of smoke or dust, since the filter 223 or the like degrades if the outdoor air is introduced, the control content is decided such that the return air is cooled regardless of the temperature and humidity condition of the outdoor air. Specifically, the air conditioning control content setting unit 253 decides the control content such that the outdoor air introduction rate becomes 0% by closing the exhaust damper 30 and the second return air introducing damper 229, fully opening the first return air introducing damper 221, and closing the outdoor air introducing damper 222, and the cooling coil 225 performs the cooling process on the introduced return air. At this time, the humidifying process by the humidifier 224 is not performed.

When the air conditioning control content is set in the air conditioning control content setting unit 253 through the above-described process, the device controller 254 generates control signals used to control the opening degrees of the exhaust damper 30, the first return air introducing damper 221, the second return air introducing damper 229, and the outdoor air introducing damper 222, control variables of the humidifier 224 and the cooling coil 225, and the speed of revolution of the air supply fan 226 based on the air conditioning control content, the control signals are transmitted to the respective devices, and thus the supply air having the supply air temperature value and the supply air humidity value within the target range is generated.

Further, in the warm-temperature region or the like, the air conditioning control content may be changed according to the outdoor air condition at every season, and in tropical rain forest climate province or the like, the air conditioning control content may be changed according to the outdoor air condition within one day. In this case, the outdoor air temperature/humidity measurement value acquiring unit 252 acquires each measurement value twice or more within one day, and the air conditioning control content setting unit 253 sets a necessary air conditioning control content with the acquisition of each measurement value by the outdoor air temperature/humidity measurement value acquiring unit 252. Further, the exceptional air conditioning control is executed as necessary based on the amount of smoke or dust measured by the environmental sensor 28.

As described above, according to the present embodiment, the air conditioning control content is changed according to the outdoor air condition, the outdoor air is used as much as possible, control suitable for server management is performed, and thus air conditioning control of managing the server with the high energy saving effect may be performed.

Further, since the air conditioning control is performed using the outdoor air as much as possible, energy necessary for air conditioning may be reduced, and the cost necessary for operating the server room management system may be reduced.

Furthermore, even when the outdoor air condition is the high temperature and high humidity as in tropical rain forest climate province, the air conditioning control content is changed according to a change in the outdoor air condition within one day, and thus the air conditioning control having the high energy saving effect for server management may be implemented.

In addition, in the air conditioning controller 25 according to the present embodiment, when the air conditioning control content is set in the air conditioning control content setting unit 253, the optimal supply air temperature target value and the supply air humidity target value are calculated within the supply air temperature target range and the supply air humidity target range stored in the supply air target range information storage unit 251, and the air conditioning control content having the high energy saving effect is set based on the target values.

Next, a process of calculating the supply air temperature target value and the supply air humidity target value that cause consumption energy to be minimized as the optimal supply air temperature target value and the supply air humidity target value according to the present embodiment will be described in detail.

First, energy E consumed by the air conditioning apparatus 20 may be expressed by the following Formula (10).

$$E = gcol(Fs \times (\alpha Ho + (1-\alpha)Hr - Hs)) + gfan(Fs) + ghum(Fw) \quad (10)$$

where
Fs: supply air current amount
Fw: humidification water quantity
α: outdoor air introduction rate
Ho: outdoor air specific enthalpy
Hr: return air specific enthalpy
Hs: supply air specific enthalpy
gcol: function representing relation between coil cooling quantity and cooling coil consumption energy
gfan: function representing relation between supply air current amount and fan consumption energy
ghum: function representing relation between humidification water quantity and humidifier consumption energy.

Of these, the supply water current amount Fs, humidification water quantity, the outdoor air introduction rate, the outdoor air specific enthalpy (calculated based on the outdoor air temperature/humidity measurement value), the return air specific enthalpy (calculated based on the return air temperature measurement value and the supply air absolute humidity measurement value), the supply air specific enthalpy (calculated based on the supply air temperature/humidity measurement value) may be measured or calculated based on the measurement values. Here, a sensible heat load by heat generated from a plurality of servers in the server room 10 is assumed as a target of air conditioning control, a latent heat load by human breath or the like is assumed not to be generated, and the return air humidity value is the same as the supply air humidity measurement value measured by the supply air humidity sensor 228.

Further, the function gcol representing the relation between the coil cooling quantity and the cooling coil consumption energy, the function gfan representing the relation between the supply air current amount and the fan consumption energy, and the function ghum representing the relation between the humidification water quantity and the humidifier consumption energy are known functions representing a characteristic of a device configuring the air conditioning controller 25. Thus, the energy E consumed by the air conditioning apparatus 20 may be calculated based on these values.

Meanwhile, the air conditioning controller 25 according to the present embodiment decides necessary control variables of the exhaust damper 30, the first return air introducing damper 221, the second return air introducing damper 229, the outdoor air introducing damper 222, the cooling coil 225, and the humidifier 224 by setting the supply air temperature target value and the supply air humidity target value in order to control the supply air temperature and the supply air humidity by any one of the process of controlling the outdoor air introduction rate based on the opening degrees of the exhaust damper 30, the first return air introducing damper 221, the second return air introducing damper 229, and the outdoor air introducing damper 222, the process of controlling the cooling quantity of the supply air through the cooling coil 225, and the process of controlling the humidification quantity by the humidifier 224 or a combination of a plurality of processes as described above.

Further, the supply air current amount value Fs is calculated by the following Formula (11) using a return air temperature measurement value Tr, a supply air temperature measurement value Ts0, an air specific heat C, and a heat generation amount Q of the server.

$$Fs = Q/C/(Tr - Ts0) \quad (11)$$

In this case, when the supply air temperature target value, the supply air humidity target value, and the supply air current amount value are given, the necessary consumption energy E may be calculated using Formula (10).

In other words, in the air conditioning control of the server room 10 using the air conditioning controller 25 according to the present embodiment, theoretically, an operation is performed at minimum necessary energy when control is performed by a combination of the supply air temperature value, the supply air humidity value, and the supply air current amount value that cause the consumption energy E calculated by Formula (10) to be minimum.

In this regard, the supply air temperature target value and the supply air humidity target value that cause the consumption energy to be minimum in the outdoor air temperature, the outdoor air humidity, and the server load of various conditions may be calculated in advance, and an outdoor air condition/air supply condition relation table representing a relation thereof may be generated and stored in the air conditioning control content setting unit 253. In this case, the condition of the supply air that causes the consumption energy to be minimum may be calculated based on the condition of the measured outdoor air and the server load.

Here, the server load Q may be calculated using consumption power of the server or using the following Formula (12). When the server load Q is calculated using the following Formula (12), the air conditioning control content setting unit 253 executes the process of calculating the server load Q before the process of calculating the air supply condition based on the outdoor air condition/air supply condition relation table.

$$Q = Fs \times C \times (Tr - Ts) \quad (12)$$

where
Q: air conditioning target load
Fs: supply air current amount value
C: air specific heat
Tr: return air temperature measurement value
Ts: supply air temperature measurement value.

As described above, the air conditioning control content is decided using the supply air temperature target value and the supply air humidity target value which are calculated as described above.

As described above, control is performed while appropriately changing the supply air temperature setting value and the supply air humidity setting value having the high efficiency according to the change in the outdoor air condition, and thus even when the use environment of the present system is an environment (region) of high-temperature and humidity, the air conditioning control having the high energy saving effect may be executed.

Further, in the above embodiment, the values specified by the ASHRAE are used as the supply air temperature target range and the supply air humidity target range, but the present invention is not limited to this example, and other values may be used according to a status of a control target or the like. Further, a part or all of each region divided as in FIG. 3 may overlap another region.

Furthermore, the above embodiment has been described in connection with the example in which the space of the server room 10 in which a plurality of servers are installed is the air conditioning control target (the air conditioning target space) of the air conditioning apparatus 20, but the present invention is not limited to this example, and a space in which a power supply device or various kinds of devices that generate heat are stored or installed may be the air conditioning control target of the air conditioning apparatus 20. In addition, in the above embodiment, the cold area 11 and the hot area 14 are configured to be structurally separated from each other, but the cold area 11 and the hot area 14 need not be necessarily structurally separated from each other. Instead of separating the cold area 11 and the hot area 14 structurally, a side from which the supply air comes in may be configured as the cold area 11, and a side from which the return air is discharged may be configured as the hot area 14.

The exemplary embodiment of the present invention has been described above, but the above embodiment is an example and does not intend to limit the range of the invention. The novel embodiment can be implemented in various forms, and omissions, replacements, and other alternations can be made in a range not departing from the gist of the present invention. The embodiment or a modification thereof is included in the range or the gist of the invention, and included in the range equivalent to the invention set forth in the accompanying claims.

The invention claimed is:

1. An air conditioning apparatus comprising:
an indoor unit that introduces at least one of outdoor air and return air from an air conditioning control target, and discharges the introduced air to the air conditioning control target as supply air; and
an air conditioning controller; wherein
the indoor unit comprises:
  a first space comprising an outdoor air introducing unit introducing the outdoor air, a first return air introducing unit introducing the return air from the air conditioning control target, a humidifier, and a cooler; and
  a second space comprising a second return air introducing unit introducing the return air; and
the air conditioning controller is configured to perform one or more processes in response to an air condition of the outdoor air to control temperature and humidity of the supply air to be within a target range of temperature, absolute humidity, and relative humidity that is set in advance; wherein
the one or more processes comprises any one of or a combination of:
  controlling an outdoor air introduction rate based on an opening degree of the first return air introducing unit, the second return air introducing unit, and the outdoor air introducing unit;
  controlling a cooling quantity by the cooler; and
  controlling a humidification quantity by the humidifier; and
when the air condition of the outdoor air corresponds to a first range, the air conditioning controller is configured:
  to close the first return air introducing unit and open the outdoor air introducing unit and the second return air introducing unit;
  to cool and humidify, by the cooler and the humidifier, the outdoor air introduced from the opened outdoor air introducing unit;
  to mix the cooled and humidified outdoor air with the return air introduced from the opened second return air introducing unit to generate the supply air of which temperature and humidity are within the target range; wherein
the first range is:
  larger than an upper limit value of absolute humidity of the target range; and
  equal to or less than a value of enthalpy corresponding to the upper limit value of the absolute humidity of the target range and temperature of the return air.

2. The air conditioning apparatus according to claim 1, wherein the air conditioning controller is configured:
  to acquire measurement values of temperature and humidity of the outdoor air, and temperature of the return air twice or more within one day; and
  to determine whether or not air conditioning control is necessary according to acquisition of the measurement values.

3. The air conditioning apparatus according to claim 1, further comprising a server room, wherein
the air conditioning control target is a space within the server room, the server room comprises a third space and a fourth space which are separated from each other, a server is installed between the third space and the fourth space, and supply air flowing into the third space is heated by heat generation of the server to flow out through the fourth space as return air.

4. An air conditioning apparatus comprising:
an indoor unit that introduces at least one of outdoor air and return air from an air conditioning control target, and discharges the introduced air to the air conditioning control target as supply air; and
an air conditioning controller; wherein
the indoor unit comprises:
  a first space comprising an outdoor air introducing unit introducing the outdoor air, a first return air introducing unit introducing the return air from the air conditioning control target, a humidifier, and a cooler; and
  a second space comprising a second return air introducing unit introducing the return air; and
the air conditioning controller is configured to perform one or more processes in response to an air condition of the outdoor air to control temperature and humidity of the supply air to be within a target range of temperature, absolute humidity, and relative humidity that is set in advance; wherein
the one or more processes comprises any one of or a combination of:
  controlling an outdoor air introduction rate based on an opening degree of the first return air introducing unit, the second return air introducing unit, and the outdoor air introducing unit;
  controlling a cooling quantity by the cooler; and
  controlling a humidification quantity by the humidifier; and
when the air condition of the outdoor air corresponds to a second range, the air conditioning controller is configured:
  to close the first return air introducing unit and the second return air introducing unit, and open the outdoor air introducing unit to introduce the outdoor air;
  to cool, by the cooler, the outdoor air introduced from the opened outdoor air introducing unit to generate the supply air of which temperature and humidity are within the target range; wherein the second range is:
   less than the upper limit value of the absolute humidity of the target range;
   larger than an upper limit value of an enthalpy corresponding to the target range;
   equal to or less than the temperature of the return air; and
   larger than a upper limit value of temperature of the target range.

5. The air conditioning apparatus according to claim 4, wherein
   the air conditioning controller is configured:
      to acquire measurement values of temperature and humidity of the outdoor air, and temperature of the return air twice or more within one day; and
      to determine whether or not air conditioning control is necessary according to acquisition of the measurement values.

6. The air conditioning apparatus according to claim 4, further comprising a server room, wherein
   the air conditioning control target is a space within the server room, the server room comprises a third space and a fourth space which are separated from each other, a server is installed between the third space and the fourth space, and supply air flowing into the third space is heated by heat generation of the server to flow out through the fourth space as return air.

7. An air conditioning control method of an air conditioning apparatus,
   the air conditioning apparatus comprising:
      an indoor unit that introduces at least one of outdoor air and return air from an air conditioning control target, and discharges the introduced air to the air conditioning control target as supply air; and
      an air conditioning controller; wherein
      the indoor unit comprises:
         a first space comprising an outdoor air introducing unit introducing the outdoor air, a first return air introducing unit introducing the return air from the air conditioning control target, a humidifier, and a cooler; and
         a second space comprising a second return air introducing unit introducing the return air;
   the air conditioning control method comprising:
      performing, by the air conditioning controller, one or more processes in response to an air condition of the outdoor air to control temperature and humidity of the supply air to be within a target range of temperature, absolute humidity, and relative humidity that is set in advance; wherein
      the one or more processes comprises any one of or a combination of:
         controlling an outdoor air introduction rate based on an opening degree of the first return air introducing unit, the second return air introducing unit, and the outdoor air introducing unit;
         controlling a cooling quantity by the cooler; and
         controlling a humidification quantity by the humidifier; and
   when the air condition of the outdoor air corresponds to a first range, the air conditioning controller is configured:
      to close the first return air introducing unit and open the outdoor air introducing unit and the second return air introducing unit;
      to cool and humidify, by the cooler and the humidifier, the outdoor air introduced from the opened outdoor air introducing unit;
      to mix the cooled and humidified outdoor air with the return air introduced from the opened second return air introducing unit to generate the supply air of which temperature and humidity are within the target range; wherein
   the first range is:
      larger than an upper limit value of absolute humidity of the target range; and
      equal to or less than a value of enthalpy corresponding to the upper limit value of the absolute humidity of the target range and temperature of the return air.

8. An air conditioning control method of an air conditioning apparatus,
   the air conditioning apparatus comprising:
      an indoor unit that introduces at least one of outdoor air and return air from an air conditioning control target, and discharges the introduced air to the air conditioning control target as supply air; and
      an air conditioning controller; wherein
      the indoor unit comprises:
         a first space comprising an outdoor air introducing unit introducing the outdoor air, a first return air introducing unit introducing the return air from the air conditioning control target, a humidifier, and a cooler; and
         a second space comprising a second return air introducing unit introducing the return air;
   the air conditioning control method comprising:
      performing, by the air conditioning controller, one or more processes in response to an air condition of the outdoor air to control temperature and humidity of the supply air to be within a target range of temperature, absolute humidity, and relative humidity that is set in advance; wherein
      the one or more processes comprises any one of or a combination of:
         controlling an outdoor air introduction rate based on an opening degree of the first return air introducing unit, the second return air introducing unit, and the outdoor air introducing unit;
         controlling a cooling quantity by the cooler; and
         controlling a humidification quantity by the humidifier; and
   when the air condition of the outdoor air corresponds to a second range, the air conditioning controller is configured:
      to close the first return air introducing unit and the second return air introducing unit, and open the outdoor air introducing unit to introduce the outdoor air;
      to cool, by the cooler, the outdoor air introduced from the opened outdoor air introducing unit to generate the supply air of which temperature and humidity are within the target range; wherein
   the second range is:
      less than the upper limit value of the absolute humidity of the target range;
      larger than an upper limit value of an enthalpy corresponding to the target range;
      equal to or less than the temperature of the return air; and
      larger than a upper limit value of temperature of the target range.

* * * * *